United States Patent
Lorin

(10) Patent No.: US 10,928,843 B2
(45) Date of Patent: Feb. 23, 2021

(54) METHOD AND DEVICE FOR MANAGING A SUPPLY VOLTAGE

(71) Applicant: STMicroelectronics (Grenoble 2) SAS, Grenoble (FR)

(72) Inventor: Christophe Lorin, Montbonnot (FR)

(73) Assignee: STMICROELECTRONICS (GRENOBLE 2) SAS, Grenoble (FR)

(*) Notice: Subject to any disclaimer, the term of this patent is extended or adjusted under 35 U.S.C. 154(b) by 189 days.

(21) Appl. No.: 16/111,933

(22) Filed: Aug. 24, 2018

(65) Prior Publication Data

US 2019/0064859 A1    Feb. 28, 2019

(30) Foreign Application Priority Data

Aug. 25, 2017  (FR) ...................... 17 57877

(51) Int. Cl.
| | |
|---|---|
| *G05F 1/46* | (2006.01) |
| *H02M 1/10* | (2006.01) |
| *H02M 7/04* | (2006.01) |
| *H03K 5/00* | (2006.01) |
| *H02M 1/00* | (2006.01) |
| *G06F 13/38* | (2006.01) |

(52) U.S. Cl.
CPC ............. *G05F 1/46* (2013.01); *H02M 1/10* (2013.01); *G06F 13/385* (2013.01); *H02M 7/04* (2013.01); *H02M 2001/0025* (2013.01); *H03K 5/00* (2013.01); *H03K 2005/00078* (2013.01)

(58) Field of Classification Search
CPC ........................................ G05F 1/46

USPC ................................... 307/109, 151
See application file for complete search history.

(56) References Cited

U.S. PATENT DOCUMENTS

| | | | |
|---|---|---|---|
| 2003/0210022 A1* | 11/2003 | Takemura | H02M 3/1584 323/282 |
| 2015/0340890 A1* | 11/2015 | Yao | H02M 3/33523 320/114 |
| 2015/0357928 A1 | 12/2015 | Itakura | |
| 2016/0116928 A1* | 4/2016 | Motoki | G05F 1/575 323/280 |
| 2016/0308452 A1* | 10/2016 | Motoki | H02J 7/022 |
| 2017/0264204 A1* | 9/2017 | Motoki | H02H 3/08 |
| 2018/0013300 A1* | 1/2018 | Yao | H02J 7/0047 |
| 2018/0183340 A1* | 6/2018 | Waters | H02M 1/36 |

(Continued)

FOREIGN PATENT DOCUMENTS

| | | |
|---|---|---|
| EP | 3200335 A1 | 8/2017 |
| WO | 2017008289 A1 | 1/2017 |

*Primary Examiner* — Adi Amrany
(74) *Attorney, Agent, or Firm* — Slater Matsil, LLP

(57) ABSTRACT

A device can be used for managing for managing the supply voltage on an output power supply pin of a USB Type-C source device that includes an AC-to-DC power converter for delivering the supply voltage. The source device is capable of supplying power to a receiver device. A power supply controller includes a first circuit configured to deliver a signal for discharging a capacitive network coupled to the power converter and also includes a second circuit configured to deliver, at the same time as the discharge signal, a new setpoint signal, corresponding to the new voltage delivered, to a control input of the power converter. A delay element is coupled between an output of the second circuit and the control input.

21 Claims, 5 Drawing Sheets

(56) References Cited

U.S. PATENT DOCUMENTS

2018/0316272 A1* 11/2018 Yu ..................... G06F 1/263
2019/0229626 A1* 7/2019 Phadke ................ H02M 1/08

* cited by examiner

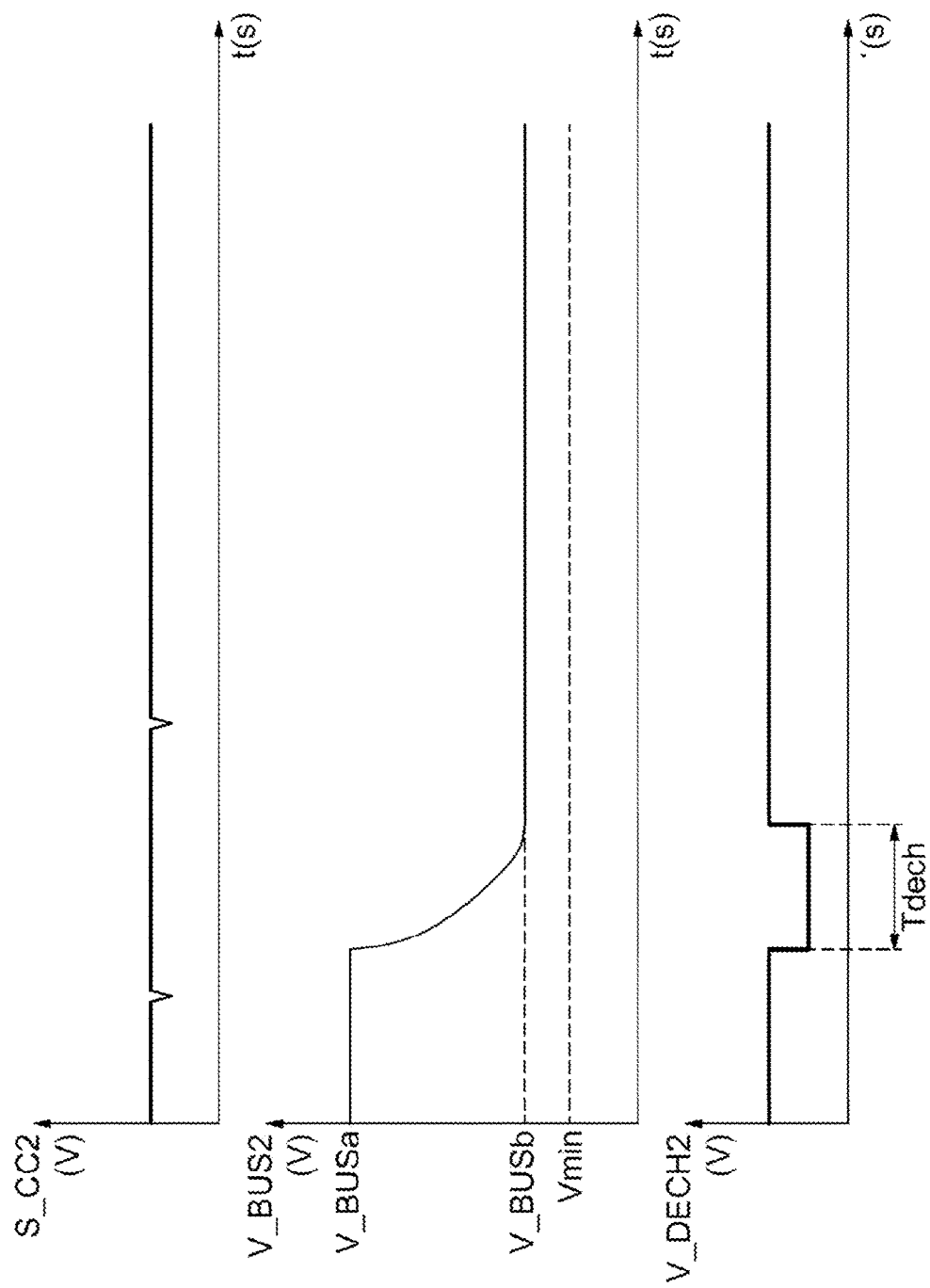

METHOD AND DEVICE FOR MANAGING A SUPPLY VOLTAGE

CROSS-REFERENCE TO RELATED APPLICATIONS

This application claims priority to French Patent Application No. 1757877, filed on Aug. 25, 2017, which application is hereby incorporated herein by reference.

TECHNICAL FIELD

Modes of implementation and embodiments of the invention relate to a method of operating a receiver device.

BACKGROUND

Theoretically, USB 3.1 Type-C devices supporting the USB power delivery mode allow data rates up to 10 GB/s and up to 100 W of power to be delivered with a maximum voltage of 20 V and a maximum current of 5 A. The power to be delivered between two USB 3.1 Type-C devices is negotiable via specific controllers and the electrical power supply may advantageously be bidirectional between various USB 3.1 Type-C devices.

A USB Type-C cable is generally designed to be coupled and establish a power supply and communication line between what is termed a USB PD Type-C "source" device and what is termed a USB PD Type-C "receiver" device.

The source device is capable of adjusting the value of the supply voltage within a range of 0 to 20 V.

FIG. 1 schematically illustrates an example of a USB PD Type-C system SYS1 known from the prior art.

The system SYS1 includes a USB Type-C source device DS1 coupled to a USB Type-C receiver device DR via a USB Type-C cable CBL. The source device DS1 is linked to an electrical power supply network R, for example an AC voltage electrical power supply network.

The source device DS1 and the receiver device DR each comprise at least one channel configuration pin CC1, at least one output supply voltage pin VBUS1 and at least one ground pin GND, the pins of the same nature being linked to one another by the cable CBL.

The source device DS1 comprises an AC-to-DC electrical power converter 1, one input E1 of which is linked to the electrical power supply network R and one output S1 of which is linked to a power supply line ALIM at a voltage V_BUS1. The power supply line is linked to the pin VBUS1 of the source device DS. A control input Ec1 of the power converter 1 is linked to an output S3 of a feedback device 3. An input E3 of the feedback device 3 is linked to the output S1 of the power converter 1 and a control input Ec3 is linked to an output S23 of a power supply controller 2.

An input E2 of the power supply controller 2 is linked to the pin CC1 of the source device DS1. A capacitor C1 is linked both to the output S1 of the power converter 1 and to the input E3 of the feedback device as well as to ground GND. Discharge circuits DECH1 and DECH2 are linked between the power supply line ALIM and ground GND, in parallel to the capacitor C1. A capacitor C2 is linked between the power supply line ALIM and ground GND. The discharge devices DECH1 and DECH2 are controlled by signals delivered to outputs S21 and S22 of the power supply controller 2, respectively, and discharge the capacitors C1 and C2, respectively.

The power supply controller 2 comprises a first circuit MD1 coupled to the outputs S21 and S22, which circuit is configured to deliver a signal for discharging the capacitors C1 and C2, and a second circuit MD2 coupled to the output S23 and configured to deliver a new setpoint signal corresponding to the new voltage delivered by the power converter 1.

The discharge circuits DECH1 and DECH2 may include transistors, in particular NMOS or PMOS transistors, and resistive impedances.

The feedback device 3 may in particular include a variable-resistance voltage divider bridge, a controllable current source, an opto-coupling device or a control loop known to those skilled in the art.

When the receiver device DR requires a power supply lower than that delivered by the source device DS1, the USB power delivery standard dictates that the supply voltage V_BUS1 should not be lower than a threshold voltage Vmin specified by the USB PD specifications and dependent on the nominal supply voltage of the receiver device DR. If the supply voltage V_BUS1 is lower than the predefined voltage Vmin, the receiver device may suddenly stop operating and lead to negative consequences for the user, in particular data loss in the case of a data storage device. The value of this threshold voltage is for example 4.75 V for a nominal supply voltage of the receiver device DR of 5 V.

A dialogue is established between the receiver device DR and the source device DS1 via the channel configuration pin CC1 through which a signal S_CC1 flows. The receiver device DR transmits the new value V_BUSb of the supply voltage V_BUS1 that is lower than the current value V_BUSa of the supply voltage V_BUS1 to the power supply controller 2. The latter acknowledges receipt of the new value V_BUSb of V_BUS1. Then, at the same time, the circuit MD1 of the power supply controller 2 drives the discharge circuits DECH1 and DECH2 so as to discharge the capacitors C1 and C2, and the circuit MD2 of the power supply controller 2 transmits a control signal to the feedback device 3 corresponding to the supply voltage V_BUSb setpoint intended for the power converter 1.

While the setpoint is being changed within the feedback device 3, the power converter 1 is no longer used: it no longer delivers power to the power supply line ALIM or to the feedback device 3.

Consequently, the power converter 1 switches to standby mode in order to save power.

The value of the voltage V_BUS1 decreases. In the event that the supply voltage V_BUS1 falls below the desired voltage value V_BUSb, the power converter 1 starts up again and switches to active mode.

During this phase of starting up the power converter 1 again, the capacitors C1 and C2 are discharged by the discharge circuits DECH1 and DECH2.

In certain cases the supply voltage V_BUS1 may drop below the threshold voltage Vmin.

FIG. 2 shows the variation in the supply voltage V_BUS1 during the decrease in this voltage from V_BUSa to V_BUSb, the control signal S_CC1 and the discharge voltage V_DECH1 across the terminals of the discharge device DECH1 according to the prior art, in the case of the supply voltage V_BUS1 dropping below the threshold voltage Vmin. It is observed that the voltage V_BUS1 is lower than the predefined threshold Vmin.

A monitoring device may control the activity of the power converter 1 such that it does not switch to standby mode. However, the implementation of such a device requires additional elements, in particular a timer. These elements increase the complexity of the source device, the power consumption and depend on the nature of the power converter 1.

Another solution known from the prior art comprises a device for controlling the discharging of the capacitors C1 and C2 that compares the supply voltage V_BUS1 with a reference voltage and stops the discharging of the capacitors C1 and C2 as soon as the supply voltage V_BUS1 has reached the reference value.

However, this solution also requires additional components, in particular an accurate comparator, and the discharge control device is complex to set up.

SUMMARY

Modes of implementation and embodiments of the invention relate to universal serial bus (USB) devices, for example, the universal serial bus devices compatible with the USB 3.1 standard supporting the USB power delivery mode (PD mode) and including reversible connectors which do not impose any connection orientation, commonly known to those skilled in the art by the name C-Type, more particularly to the adjustment of the voltage on USB cables linking two USB devices.

Embodiments of the invention can achieve a voltage that remains higher than a predetermined threshold supply voltage value in a phase of decreasing the supply voltage produced by a USB PD source device. For example, these features can be achieved while adding very few elements with respect to a USB PD source device known from the prior art.

According to modes of implementation and embodiments, it is advantageously proposed to transmit a signal for changing the supply voltage setpoint with a delay with respect to the signal for driving the discharge devices, thereby making it possible to decrease the supply voltage while the power converter is being used by the feedback device.

According to one aspect, a method is proposed for managing the supply voltage on an output power supply pin of a USB Type-C source device. An AC-to-DC power converter delivers the supply voltage. The source device is coupled to a receiver device. In response to a request to decrease the supply voltage by the receiver device, a capacitive network coupled to the power converter is discharged. A new setpoint signal corresponding to the new voltage is delivered to the power converter. The delivery of the new setpoint signal is delayed with respect to the instant in time at which the discharging of the capacitive network is initiated by a chosen delay.

According one mode of implementation, the power converter possesses a standby mode and an active mode, the transition from the standby mode to the active mode taking a start-up time, the value of the delay is fixed and at least equal to this start-up time.

According to one aspect, a device is proposed for managing the supply voltage on an output power supply pin of a USB Type-C source device that includes an AC-to-DC power converter for delivering the supply voltage. The source device is capable of supplying power to a receiver device. A power supply controller includes a first circuit configured to deliver a signal for discharging a capacitive network coupled to the power converter and a second circuit configured to deliver, at the same time as the discharge signal, a new setpoint signal, corresponding to the new voltage delivered, to a control input of the power converter. A delay element is coupled between an output of the second circuit and the control input.

Advantageously, the power converter possesses a standby mode and an active mode. The transition from the standby mode to the active mode takes a start-up time. The delay element is configured to delay the delivery of a signal by a duration that is at least equal to this start-up time.

Preferably, the device additionally comprises a feedback circuit linked between the delay element and the power converter.

Advantageously, the power supply controller includes at least a portion of the delay element.

The delay element may be outside, or partially or completely incorporated within the power supply controller.

Although it is possible to use other devices, such as a delay line or a digital-to-analogue converter, known to those skilled in the art by the acronym DAC, it is particularly advantageous to use the power supply controller. This makes it possible to save space and power, and allows the source device to be less complex.

BRIEF DESCRIPTION OF THE DRAWINGS

Other advantages and features of the invention will become apparent upon examining the detailed description of completely non-limiting embodiments and the appended drawings, in which:

FIGS. 3 to 6 schematically illustrate modes of implementation and embodiments of the invention.

DETAILED DESCRIPTION OF ILLUSTRATIVE EMBODIMENTS

Figure 3:
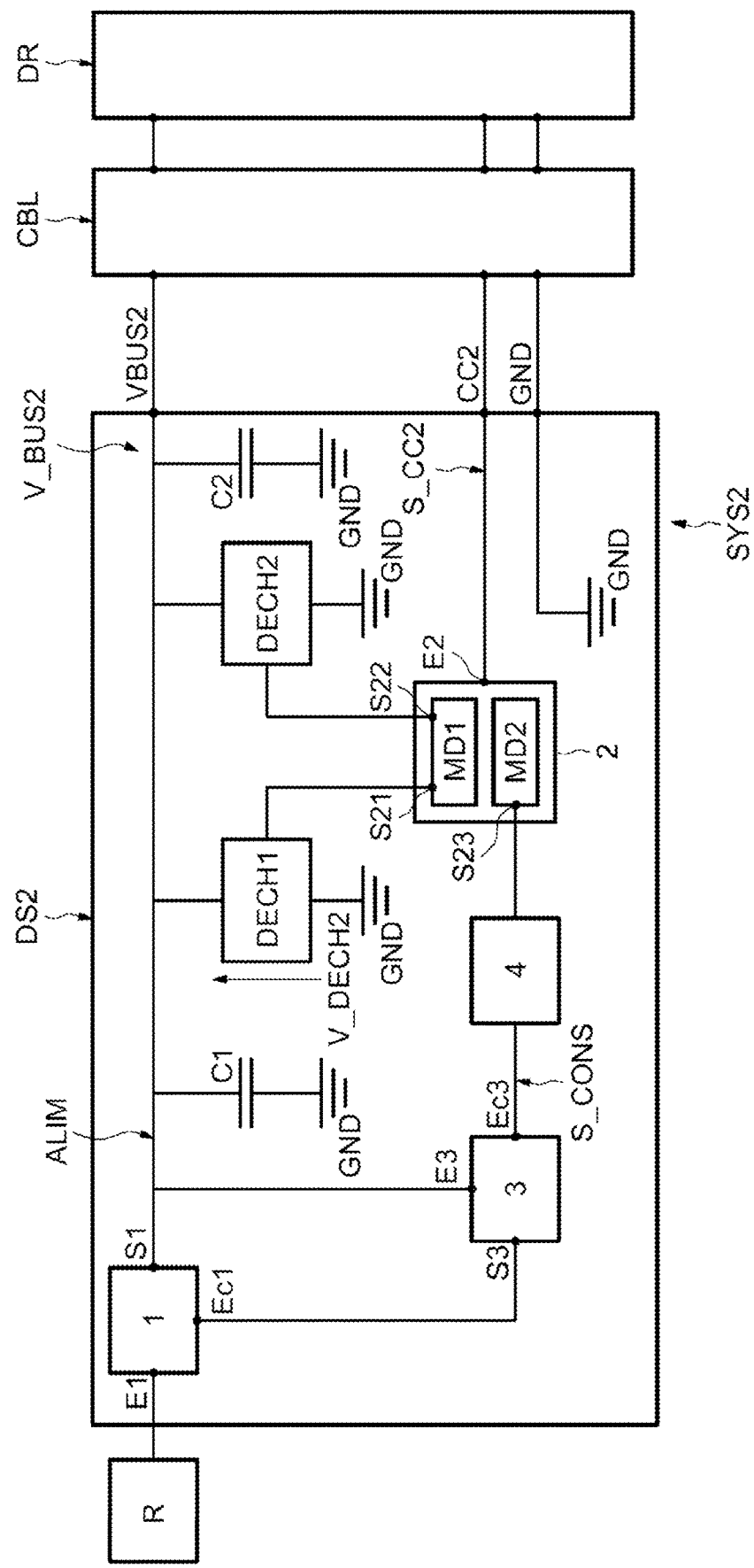

Reference is made to FIG. 3 which shows an exemplary embodiment of a USB PD Type-C system SYS2.

The system SYS2 includes a USB Type-C source device DS2 coupled to the USB Type-C receiver device DR via the USB Type-C cable CBL. The source device DS2 is linked to the AC voltage electrical power supply network R. In this context, a USB Type-C device or element includes any device or element that conforms to a USB Type-C standard in effect at the filing of this patent.

The source device DS2 comprises at least one channel configuration pin CC2, at least one output supply voltage pin VBUS2 and at least one ground pin GND, the pins of the same nature being linked to the pins of the receiver device DR by the cable CBL.

A signal S_CC2 flows through the channel configuration pin CC2.

Figure 1:
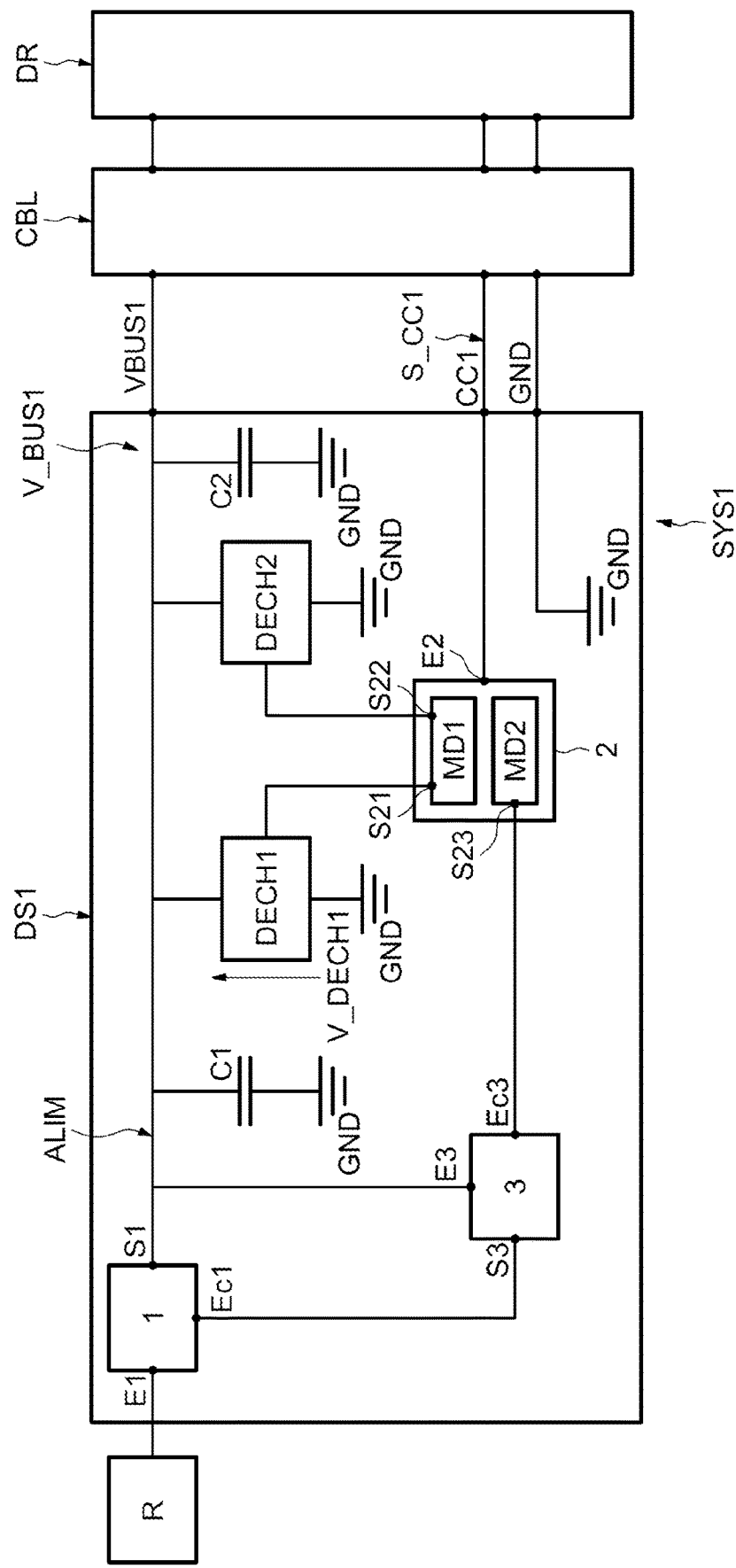
FIG. 1, described above, illustrates a USB Type-C system.

The source device DS2 comprises the AC-to-DC electrical power converter 1, the electrical power supply network R, the power supply line ALIM through which a voltage V_BUS2 flows, a feedback circuit comprising the feedback device 3, the power supply controller 2 comprising the first circuit MD1 and the second circuit MD2, the capacitors C1 and C2 and the discharge circuits DECH1 and DECH2. These elements are linked to one another as described above with reference to FIG. 1.

The source device DS2 additionally comprises a circuit 4, referred to herein as a delay element, that is configured to maintain the setpoint signal S_CONS of the feedback device 3 in its state prior to the activation of the discharge circuits DECH1 and DECH2 for a duration Tdech of activation of the discharge circuits and of delivery of the signal for changing the setpoint of the feedback device 3 at the end of the duration Tdech.

The power converter 1 possesses a standby mode and an active mode, the transition from the standby mode to the active mode takes a start-up time.

The duration Tdech is at least equal to the duration required to restart the AC-to-DC power converter 1. The duration Tdech is sometimes specified in the technical specifications of the power converter 1. In any case, a person skilled in the art will be able to determine the duration Tdech through experimentation. It is chosen for example from a period of between 1 and 16 ms.

The duration Tdech is fixed and does not depend on the voltage level V_BUS or on the setpoint voltage.

The delay element 4 is coupled between the output S23 of the second circuit MD2 and the input Ec3 of the feedback device 3.

The delay element 4 is configured to delay the delivery of a signal by a duration Tdech.

The first circuit MD1 of the power supply controller 2 is configured to deliver a signal for discharging the capacitive network comprising the capacitors C1 and C2 that is coupled to the power converter 1 and the second circuit MD2 is configured to deliver, at the same time as the discharge signal, a new setpoint signal corresponding to the new voltage delivered to the control input Ec1 of the power converter 1.

The source device DS2 comprises as many delay elements 4 as there are control inputs of the feedback device 3 linked to the power supply controller 2. In order to clarify the description of one embodiment of a USB PD Type-C system SYS2, only the control Ec3 input of the feedback device 3 is shown, linked to the delay element 4.

The delay element 4 may be outside, or partially or completely incorporated within the power supply controller 2.

The delay element may comprise a delay line, a digital-to-analog converter or be partially or completely incorporated within a portion of the power supply controller 2. These devices are well known to those skilled in the art. Preferably, the power supply controller 2 includes at least a portion of the delay element 4, thus making it possible to save space and power.

Figure 4:
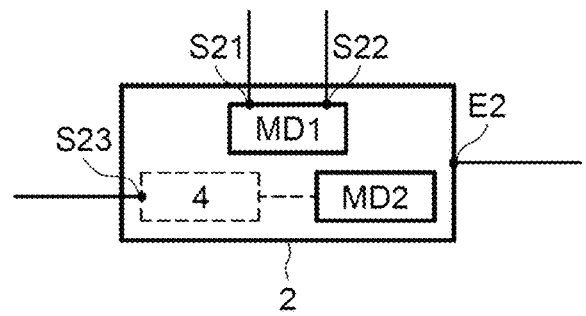

An example of a power supply controller incorporating the delay element 4 is described in FIG. 4.

It is possible to see the circuit MD1 linked to the output S21 and S22, and the circuit MD2 linked to the output S23. The delay element 4 is linked between the circuit MD2 and the output S23.

An exemplary method for decreasing the supply voltage V_BUS delivered by the source device DS2 to a receiver device DR is now described.

The elements that are identical to those described above are denoted by the same numerical references.

Figure 5:
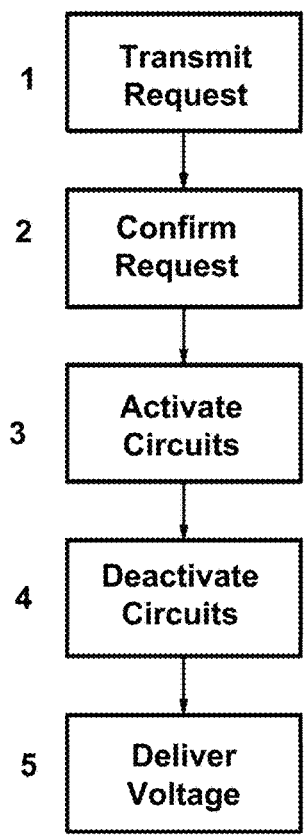

FIG. 5 illustrates a logic diagram illustrating the various steps leading to the decrease in the voltage V_BUS2 from the supply voltage value V_BUSa to a supply voltage value V_BUSb that is lower than the value V_BUSa. The value V_BUSb is required for the receiver device DR to operate correctly.

The value of the supply voltage is therefore initially equal to V_BUSa, for example 15 V.

In a first step 1, the receiver device DR transmits a signal S_CC2 including a request to decrease the supply voltage to the value V_BUSb, for example 10 V, to the power supply controller 2 of the source device DS2.

Next, in step 2, the power supply controller 2 of the source device DS2 transmits, to the receiver device DR, a signal S_CC2 including a confirmation of the implementation of the decrease in the supply voltage V_BUS2 from the value V_BUSa to the value V_BUSb.

In step 3 of duration Tdech, the first circuit MD1 of the power supply controller 2 activates the discharge circuits DECH1 and DECH2 such that the capacitors C1 and C2 are discharged and the second circuit MD2 of the power supply controller 2 simultaneously delivers, to the delay element 4, a new setpoint signal corresponding to the new voltage delivered V_BUSb. During this step the power converter 1, which is still instructed to deliver the supply voltage of value V_BUSa, delivers attempts to deliver the supply voltage V_BUSa in order to compensate for the drop in voltage of the supply voltage V_BUS2. Because it is trying to restore the supply voltage to V_BUSa while the bus is being discharged to V_BUSb, the power converter 1 is active and does not switch to standby mode.

At the end of this step, the capacitors C1 and C2 have been discharged for a duration Tdech and the power converter 1 delivers the supply voltage of value V_BUSa.

The chosen value of Tdech dictates that the voltage V_BUS2 decreases but remains higher than the threshold voltage Vmin.

Next, in step 4, at the end of the discharge duration Tdech, the discharge circuits DECH1 and DECH2 are deactivated. The capacitors C1 and C2 are partially discharged and the voltage V_BUS2 has decreased.

The delay element 4 delivers the new supply voltage V_BUSb to the power converter 1 via the feedback device 3.

The new supply voltage V_BUSb is transmitted with a delay of duration Tdech with respect to the instant in time at which the discharging of the capacitors C1 and C2 is initiated.

Stated otherwise, the delivery of the new setpoint signal corresponding to the new voltage delivered V_BUSb is delayed with respect to the instant in time at which the discharging of the capacitive network comprising the capacitors C1 and C2 is initiated by the chosen delay Tdech.

The feedback device 3 adjusts its setpoint such that the power converter 1 delivers the supply voltage V_BUSb.

The power supply line ALIM consumes the power delivered by the power converter 1, the latter remains active during the change in setpoint and consequently does not switch to standby mode.

In step 5, the power converter 1 delivers the supply voltage V_BUSb and the power controller 20 transmits, to the receiver device DR, a signal S_CC2 including a confirmation that the power supply line ALIM delivers the supply voltage V_BUS2.

Figure 2:
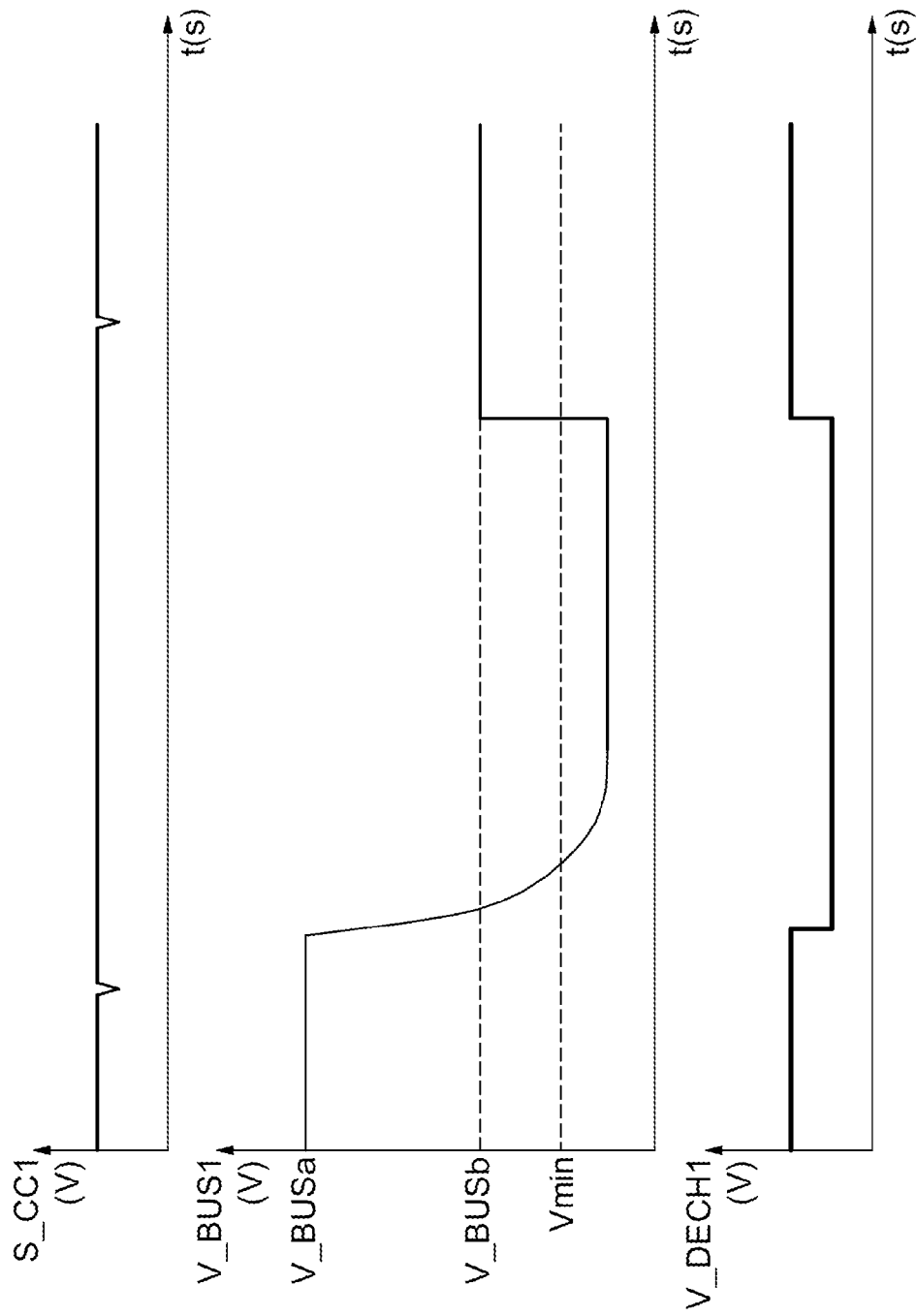
FIG. 2, described above, illustrates the variation in the supply voltage of the receiver device according to the prior art.

FIG. 6 illustrates the variation in the supply voltage V_BUS2 during the decrease in this voltage from V_BUSa to V_BUSb, the control signal S_CC2 and the discharge voltage V_DECH2 across the terminals of the discharge circuit DECH1. It can be seen that the voltage V_BUS2 remains higher than the threshold voltage Vmin during the change in the value of the voltage V_BUS2, unlike the voltage V_BUS1 of the system SYS1 according to the prior art illustrated in FIG. 2.

Advantageously, the delay element 4 incorporated within the source device DS2 makes it possible to time shift the discharging of the capacitors C1 and C2, and the change in setpoint of the feedback device 3. The delay element 4 creates a delay between the discharging of the capacitors C1 and C2 and the change in setpoint of the feedback device 3.

This delay makes it possible to use the power converter 1 throughout the entire duration of the decrease in the supply voltage V_BUS2 delivered by the power supply line ALIM. Consequently, the power converter 1 remains active and does not switch to standby mode for this entire duration.

What is claimed is:

1. A method for managing a supply voltage on an output power supply pin of a USB Type-C source device that comprises an AC-to-DC power converter, the source device being coupled to a receiver device, the method comprising:
    delivering the supply voltage from the AC-to-DC power converter;
    in response to a request from the receiver device to decrease the supply voltage to a new voltage, discharging a capacitive network coupled to the AC-to-DC power converter;
    delivering a new setpoint signal corresponding to the new voltage to a feedback circuit, wherein delivery of the new setpoint signal to the feedback circuit is delayed by a delay time with respect to an instant in time at which the discharging of the capacitive network is initiated;
    adjusting a setpoint at the feedback circuit; and
    receiving the adjusted setpoint from the feedback circuit at the AC-to-DC power converter, wherein the delay time in delivering the new setpoint signal to the feedback circuit ensures that the new setpoint signal is received at the AC-to-DC power converter after the instant in time at which the discharging of the capacitive network is initiated.

2. The method according to claim 1, wherein delivery of the new setpoint signal is delayed by a delay time between 1 and 16 ms.

3. The method according to claim 2, wherein the delay time is fixed.

4. A method for managing a supply voltage on an output power supply pin of a USB Type-C source device that comprises an AC-to-DC power converter that possesses a standby mode and an active mode, the source device being coupled to a receiver device, the method comprising:
    delivering the supply voltage from the AC-to-DC power converter;
    in response to a request from the receiver device to decrease the supply voltage to a new voltage, initiating discharge of a capacitive network coupled to the AC-to-DC power converter; and
    receiving a new setpoint signal corresponding to the new voltage at the AC-to-DC power converter, wherein the new setpoint signal is received at least a delay time after an instant in time at which the discharging of the capacitive network is initiated, the delay time having a duration of at least a time it takes the AC-to-DC convertor to transition from the standby mode to the active mode.

5. The method according to claim 4, wherein the delay time is fixed.

6. The method according to claim 4, wherein the delay time is between 1 and 16 ms.

7. A device for managing a supply voltage on an output power supply pin of a USB Type-C source device that comprises an AC-to-DC power converter configured to deliver the supply voltage, the source device being capable of supplying power to a receiver device, the device comprising:
    a first circuit configured to deliver a discharge signal for discharging a capacitive network coupled to the AC-to-DC power converter;
    a second circuit configured to deliver a new setpoint signal to a feedback circuit that is coupled to a control input of the AC-to-DC power converter to adjust a setpoint of the AC-to-DC power converter, the new setpoint signal to be delivered from the second circuit at the same time the discharge signal is delivered from the first circuit; and
    a delay element coupled between an output of the second circuit and the control input of the AC-to-DC power converter, wherein the delay element is configured to ensure that the new setpoint signal is received at the AC-to-DC converter after the discharge signal is received at the capacitive network.

8. The device according to claim 7, wherein the AC-to-DC power converter possesses a standby mode and an active mode, wherein a transition from the standby mode to the active mode takes a start-up time, and wherein the delay element is configured to delay delivery of a signal from the second circuit to the control input by a duration that is at least equal to the start-up time.

9. The device according to claim 7, wherein the delay element is configured to introduce a delay that is greater than or equal to a time it takes the AC-to-DC power converter to transition from a standby mode to an active mode.

10. The device according to claim 9, wherein the delay element is configured to introduce a fixed delay.

11. The device according to claim 7, wherein the delay element is configured to introduce a delay between 1 and 16 ms.

12. The device according to claim 7, wherein the first circuit and the second circuit are part of a power supply controller that also includes at least a portion of the delay element.

13. The device according to claim 7, wherein the delay element comprises a delay line.

14. The device according to claim 7, wherein the delay element comprises an analog-to-digital converter.

15. A USB Type-C source device comprising:
    an output power supply pin;
    an AC-to-DC power converter having an output coupled to the output power supply pin;
    a capacitive network coupled to the AC-to-DC power converter;
    a first circuit configured to deliver a discharge signal to the capacitive network;
    a feedback circuit coupled to the output power supply pin and configured to adjust a setpoint of the AC-to-DC power converter, the feedback circuit including an input and an output, the output coupled to a control input of the AC-to-DC power converter;
    a second circuit configured to deliver a new setpoint signal to the control input of the AC-to-DC power converter via the feedback circuit; and
    a delay element coupled between an output of the second circuit and an input of the feedback circuit, the delay element configured to introduce a delay so that the new setpoint signal is received at feedback circuit after the discharge signal is received at the capacitive network by at least a delay time.

16. The device according to claim 15, wherein the AC-to-DC power converter possesses a standby mode and an active mode, wherein a transition from the standby mode to the active mode takes a start-up time, and wherein the delay time is at least equal to the start-up time.

17. The device according to claim 15, wherein the delay element is configured to introduce a delay that is greater than or equal to a time it takes the AC-to-DC power converter to transition from a standby mode to an active mode.

18. The device according to claim 17, wherein the delay element is configured to introduce a fixed delay.

19. The device according to claim 15, wherein the delay element is configured to introduce a delay between 1 and 16 ms.

20. The device according to claim 15, wherein the first circuit and the second circuit are part of a power supply controller that also includes at least a portion of the delay element.

21. A method for managing a supply voltage on an output power supply pin of a USB Type-C source device that comprises an AC-to-DC power converter, the source device being coupled to a receiver device, the method comprising:

delivering the supply voltage from the AC-to-DC power converter;

receiving a request from the receiver device to decrease the supply voltage to a new voltage;

generating a new setpoint signal corresponding to the new voltage and a discharge control signal in response to the received request;

delivering the discharge control signal to a capacitive network coupled to the AC-to-DC power converter to cause the capacitive network to discharge;

delivering the new setpoint signal to a delay element;

delivering the new setpoint signal from the delay element to a feedback circuit, wherein delivery of the new setpoint signal to the feedback circuit is delayed by the delay element with respect to an instant in time at which the discharge control signal is delivered to the capacitive network; and delivering the new setpoint signal from the feedback circuit to the AC-to-DC power converter.

\* \* \* \* \*